(12) United States Patent
Baccini

(10) Patent No.: US 8,104,168 B2
(45) Date of Patent: Jan. 31, 2012

(54) POSITIONING DEVICE TO POSITION ONE OR MORE PLATES OF ELECTRONIC CIRCUITS, IN A METAL DEPOSITION UNIT

(75) Inventor: Andrea Baccini, San Biagio di Callalta (IT)

(73) Assignee: Applied Materials Italia S.R.L., Treviso (IT)

( * ) Notice: Subject to any disclaimer, the term of this patent is extended or adjusted under 35 U.S.C. 154(b) by 568 days.

(21) Appl. No.: 12/256,707

(22) Filed: Oct. 23, 2008

(65) Prior Publication Data

US 2009/0265926 A1  Oct. 29, 2009

(30) Foreign Application Priority Data

Oct. 24, 2007  (IT) .............................. UD2007A0198

(51) Int. Cl.
*B23P 19/00* (2006.01)
(52) U.S. Cl. .............................. 29/759; 29/760; 29/761
(58) Field of Classification Search .................... 29/759, 29/745, 760, 761, 825; 101/123, 126, 129; 219/385, 452.11, 458.1, 462.1, 532
See application file for complete search history.

(56) References Cited

U.S. PATENT DOCUMENTS

| 4,981,074 | A | 1/1991 | Machita et al. |
| 5,105,066 | A | 4/1992 | Houdy et al. |
| 5,372,972 | A | 12/1994 | Hayashi et al. |
| 5,740,729 | A | 4/1998 | Hikita et al. |
| 7,827,910 | B2 * | 11/2010 | Hilpert et al. ................. 101/129 |
| 2008/0034990 | A1 | 2/2008 | Hilpert et al. |

FOREIGN PATENT DOCUMENTS

| DE | 10 2006 015 686 | 8/2007 |
| EP | 0 535 399 | 4/1993 |

* cited by examiner

*Primary Examiner* — Thiem Phan
(74) *Attorney, Agent, or Firm* — Patterson & Sheridan, L.L.P.

(57) ABSTRACT

A positioning device to position one or more plates of electronic circuits with respect to an operating unit. The device comprises a rotary member which rotates selectively between a first operating position and a second operating position, and a positioning member mounted on the rotary member. The positioning member comprises a frame, which is mounted removably on the rotary member, and a strip of transpirant material on which each plate is rested. The strip is wound between a pair of winding/unwinding rollers, pivoted on the frame. The positioning member also comprises heating means able to heat the wafer to take it to a determinate operating temperature.

24 Claims, 8 Drawing Sheets

# POSITIONING DEVICE TO POSITION ONE OR MORE PLATES OF ELECTRONIC CIRCUITS, IN A METAL DEPOSITION UNIT

FIELD OF THE INVENTION

The present invention concerns a device to position plates for electronic circuits, for example green tape, silicon based wafers for photovoltaic cells, in a metal deposition unit, for example by means of silk-screen printing. In particular, the positioning device according to the present invention is applied to a transport member, for example a rotating turret, or a carousel, which carries the plates from a loading station to a discharge station, passing through at least a metal deposition station.

BACKGROUND OF THE INVENTION

Plants are known for working plates of electronic circuits, for example wafers for the production of photovoltaic cells, which comprise at least a unit to deposit metal tracks on the plates and a positioning device that positions and transports the plates with respect to the deposition unit, and other possible work stations.

A positioning device is known, which comprises at least a feed belt to feed the plates and a rotating turret, or carousel, on which the plates fed by the feed belt are placed. The turret can be rotated at certain angles so as to transport and position each plate in defined operating positions of the deposition unit, so as to achieve the electronic circuits.

This type of transport member requires specific members to position the plates, which comprise at least a supporting plane mounted on the turret and on which the plate exiting the conveyor belt is initially deposited.

In order to guarantee the precision of the deposition of each metallic track on the plate, it is necessary to associate with the positioning device both a calibration and alignment station, to correct the position of the plate on the plane, and also a specific pick-up and discharge member, which moves the finished plates individually towards a discharge belt.

This entails a consequent increase both in production costs, and in the operating time of the plant, with an unavoidable reduction in productivity.

A positioning device is also known, wherein, instead of the supporting plane, a sliding belt is present on the turret, made of transpirant material, for example paper, wound between two winding/unwinding rollers.

This solution, even if it allows to guide the deposition of the plates on the turret, entails long maintenance steps and therefore inactivity of the plant, due to the need to control, each time, the efficiency of the paper strip after the treatment, and also to perform a periodical substitution of the paper strip, once this has been completely wound onto one of the rollers.

Furthermore, such maintenance steps are rather complex and require the intervention of particularly qualified personnel, or the use of sophisticated or particularly expensive equipment.

Plants for the treatment of plates are also known, in which the unit for the deposition of metal tracks acts by means of silk-screen printing with hot paste, or with cold paste.

In both known solutions, errors can occur, or smudges, in the deposition of the metallic tracks, mainly due to the relatively high differences in temperature between the printed paste and the surface of the plate.

In the state of the art, due to the high thermal gradient of the paste, difficulties or imperfections have also been found in the drying of the printed paste. This entails both incorrect prints and cracks or breaks that can interrupt or modify the correct conductivity of the printed tracks.

One purpose of the present invention is to achieve a positioning device of plates of electronic circuits, which is simple and economical to make and which allows a precise positioning of the plates on the transport member, without the need for long and costly steps of correcting the position of the plates.

Another purpose of the present invention is to achieve a device for positioning plates which does not require long, complex and costly maintenance steps for its replacement.

A further purpose of the present invention is to achieve a device for positioning plates that allows to limit to a minimum the possibility of errors, or smudges, in the deposition of the metal tracks, as well as the formation of cracks or breaks in the printed tracks during drying.

The Applicant has devised, tested and embodied the present invention to overcome the shortcomings of the state of the art and to obtain these and other purposes and advantages.

SUMMARY OF THE INVENTION

The present invention is set forth and characterized in the independent claims, while the dependent claims describe other characteristics of the invention or variants to the main inventive idea.

A positioning device according to the present invention is applied to position plates for electronic circuits, for example silicon based wafers, with respect to an operating unit.

The positioning device according to the invention comprises a rotary member able to selectively rotate at least between a first operating position and a second operating position, and a positioning member able to be mounted on the rotary member.

According to a characteristic feature of the present invention, the positioning member comprises at least a frame, which is mounted in a removable manner on the rotary member, and a belt made of transpirant material on which each plate is rested.

Furthermore, the belt is wound between a pair of winding/unwinding rollers, associated with the frame.

The present invention therefore allows to selectively remove the positioning device from the rotary element, so as to be replaced with another, for example with different sizes and/or functionality, or simply when the transpirant belt is finished.

The selective dismantling of the device therefore allows to speed up and simplify the operations to replace the belt, limiting possible interruptions in production to a minimum, increasing productivity and reducing the overall management costs of the transport member.

According to a variant, the removable frame comprises rapid attachment means, of the removable and/or temporary fixed association type, conformed so as to allow at least the reciprocal mechanical, electrical, and possibly pneumatic connections of the device to the rotary element, with a limited number of operations, advantageously only the sliding insertion of the frame into a coordinated seating achieved on the rotary element.

According to another variant, the device according to the invention comprises at least a motorized roller able to be selectively brought into cooperation with one of the two winding/unwinding rollers, in order to determine the movement of the transpirant belt, and therefore of the plate towards, or from, the rotary element.

Advantageously, the motorized roller is mounted on the rotary element in correspondence with a loading and/or unloading station of the plates.

According to another variant, the removable frame also comprises lighting means disposed below the transpirant belt so as to determine a retro-illumination effect, and to facilitate the operations to control and correct the position of the plate on the transpirant belt.

According to another variant, the removable frame comprises suction means disposed in cooperation with the transpirant belt and able to hold the plate, by pneumatic depression, in a determinate operating position above the transpirant belt.

The positioning device according to the invention also comprises heating means of the regulable type, mounted on the positioning member, and able to heat the plate in order to bring it to a determinate operating temperature.

Advantageously, the heating can be regulated both manually and automatically, and can be provided before, after and/or during, the deposition of the metal.

In this way, the thermal difference between the plate and the metallic paste, hot or cold, deposited on the plate, is considerably reduced. This considerably limits the risk both of imprecisions and of smudges in the deposition, and the formation of cracks or breaks during drying.

BRIEF DESCRIPTION OF THE DRAWINGS

These and other characteristics of the present invention will become apparent from the following description of a preferential form of embodiment, given as a non-restrictive example with reference to the attached drawings wherein.

DETAILED DESCRIPTION OF A PREFERENTIAL FORM OF EMBODIMENT

Figure 1:
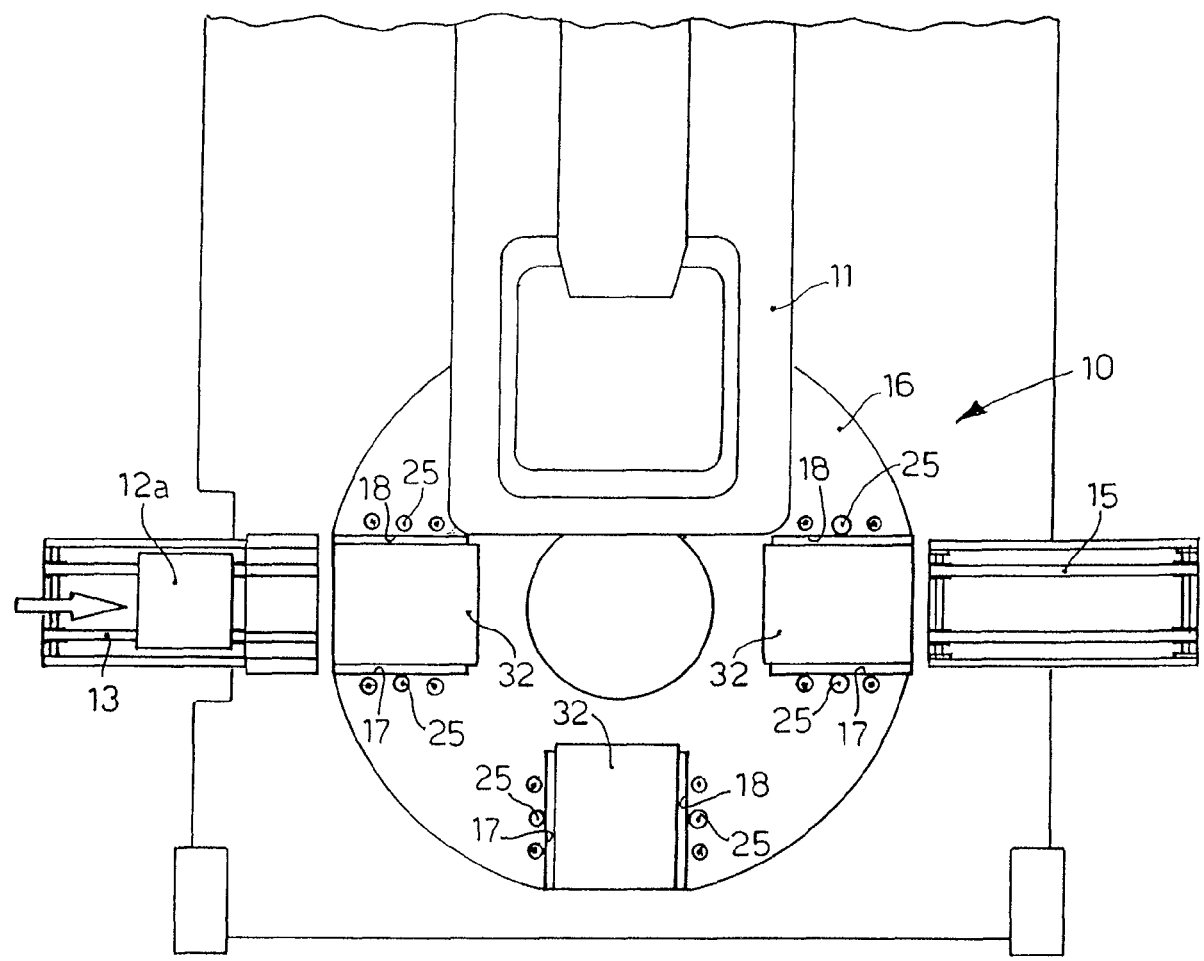
FIG. 1 schematically shows a top view of a unit to deposit metal on a plate of an electronic circuit provided with a positioning device according to the present invention.

With reference to the attached drawings, a positioning device 10 according to the present invention is mounted on a metal deposition unit 11 of a plant for the production, in this case, of photovoltaic cells 12b starting from a silicon based wafer 12a.

The wafers 12a and the photovoltaic cells 12b are moved and positioned with respect to the metal deposition unit 11 by means of: a first conveyor belt 13 that feeds the wafers 12a; a second conveyor belt 15 that discharges the photovoltaic cells 12b; and a rotating turret 16 interposed between the two belts 13 and 15, which, as will be explained hereafter, carries, in a carousel manner, the wafers 12a and the photovoltaic cells 12b between the various operating positions.

The positioning device 10 comprises one or more positioning members 17, in this case four, angularly offset at about 90° with respect to each other, and mounted on the rotating turret 16 by means of a removable frame 24, inside coordinated assembly seatings 18 made peripherally on the rotating turret 16.

Each removable frame 24 (FIG. 3) comprises rapid attachment members, respectively mechanical 19, electric 20 and pneumatic 21.

In particular, the mechanical attachment members 19 comprise, in this case, two linear ribs 22 made along the sides of the frame 24 and able to slide in mating attachment grooves, not shown, made inside each assembly seating 18.

The linear ribs 22 have an interruption 23 that defines the positioning seating of relative attachment pins 25, so as to temporarily lock the frame 24 in the relative assembly seating 18.

The electric attachment members 20 comprise, in this case, two or more metal platelets 26 mounted on the front wall of the frame 24, and able to be contacted by corresponding conductors, not shown, provided inside the assembly seating 18.

The pneumatic attachment members 21 comprise, in the case shown here, two or more conduits 27, also made on the front wall of the frame 24, and able to connect with corresponding pneumatic connections, not shown, provided inside the assembly seating 18.

The frame 24 also comprises an upper surface 29 supporting the wafer 12a or the photovoltaic cell 12b, and two supporting rollers 30 and 31 around which a paper strip 32 is wound.

The wafer 12a coming from the first conveyor belt 13, or the photovoltaic cell 12b to be carried towards the second conveyor belt 15, are positioned on the paper strip 32.

In particular, the upper surface 29 comprises a plurality of suction holes 34, able to define a pneumatic depression that allows the partial holding of the wafer 12a or of the photovoltaic cell 12b on the frame 24.

Figure 3:
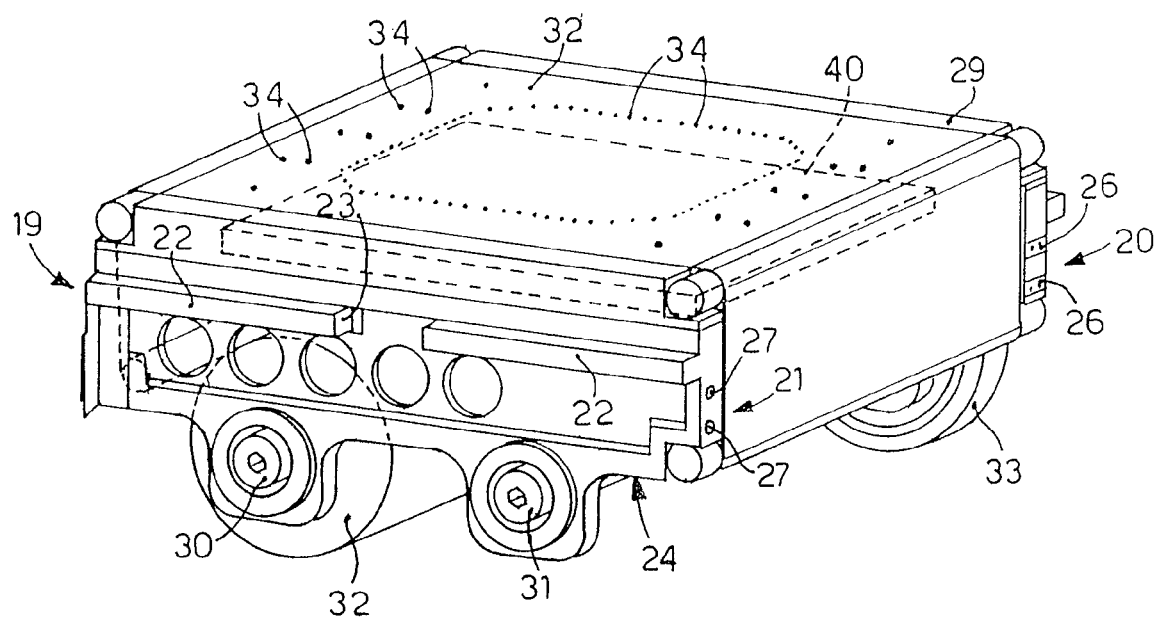
FIG. 3 shows a blown-up and partially sectioned detail of the positioning device in FIG. 1.
Figure 4A:
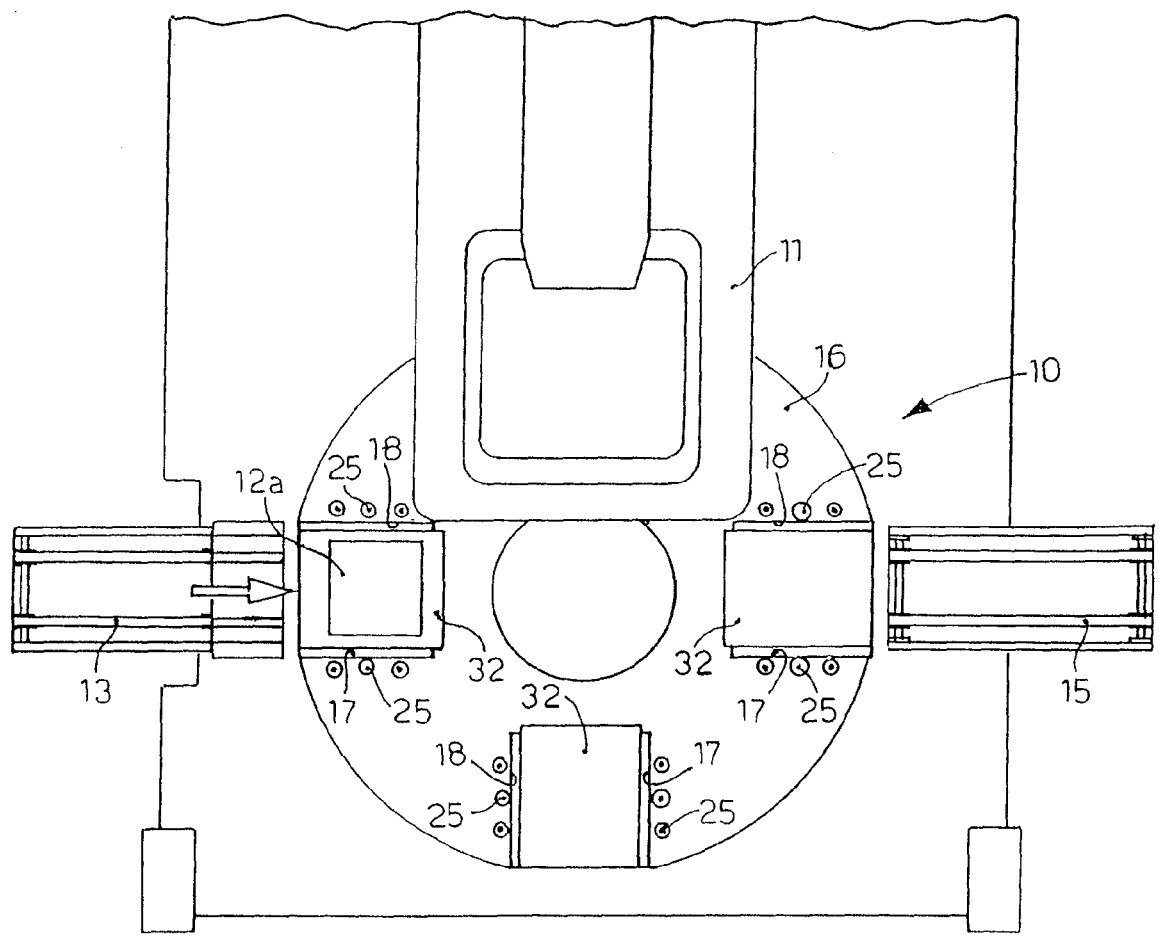
FIGS. 4a-4e show, in sequence, some operating steps of the deposition unit in FIG. 1.
Figure 4B:
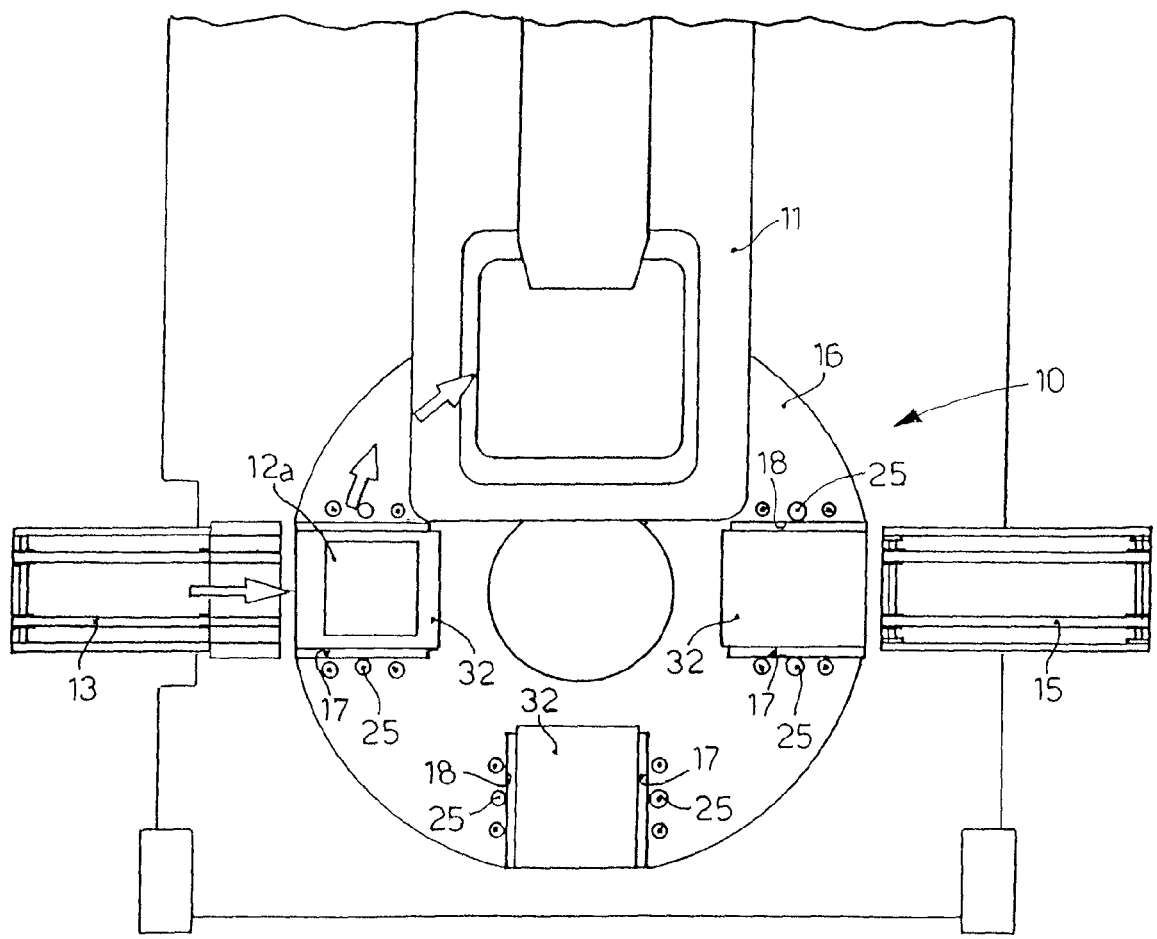
Figure 4C:
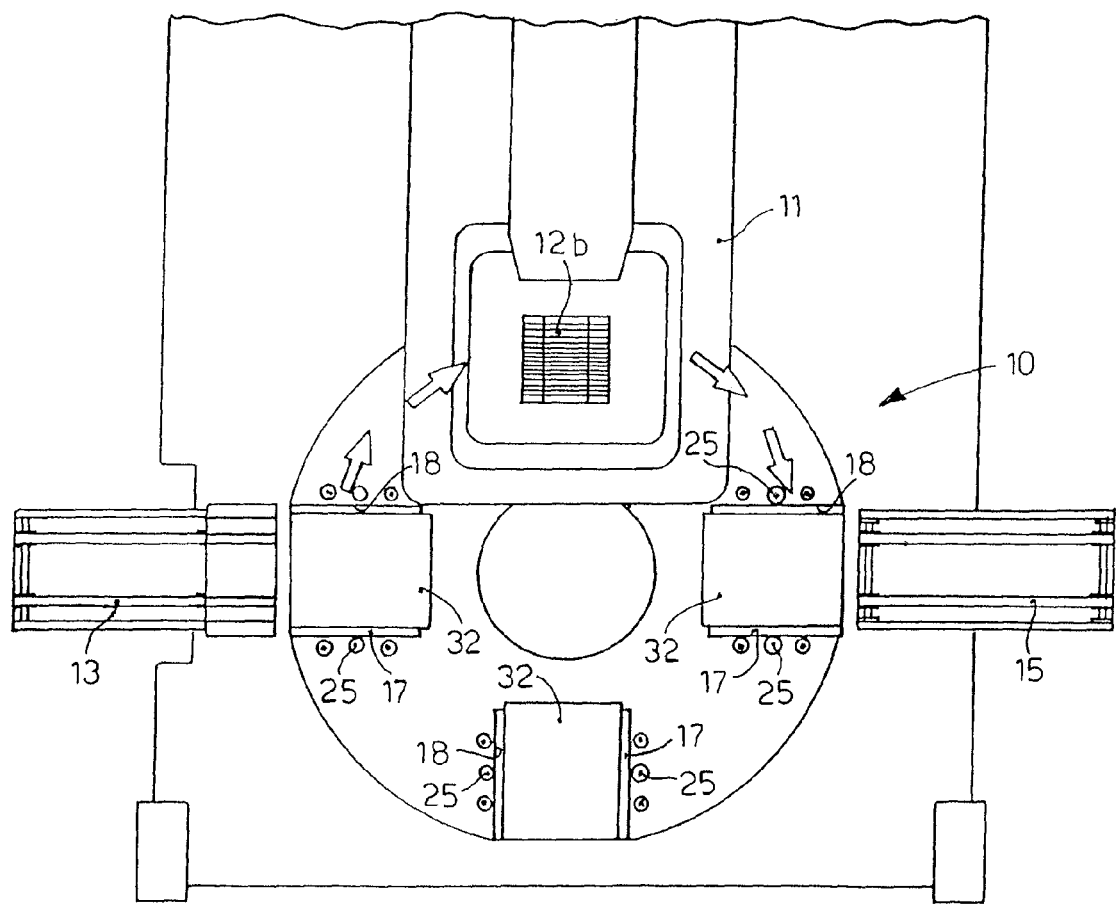
Figure 4D:
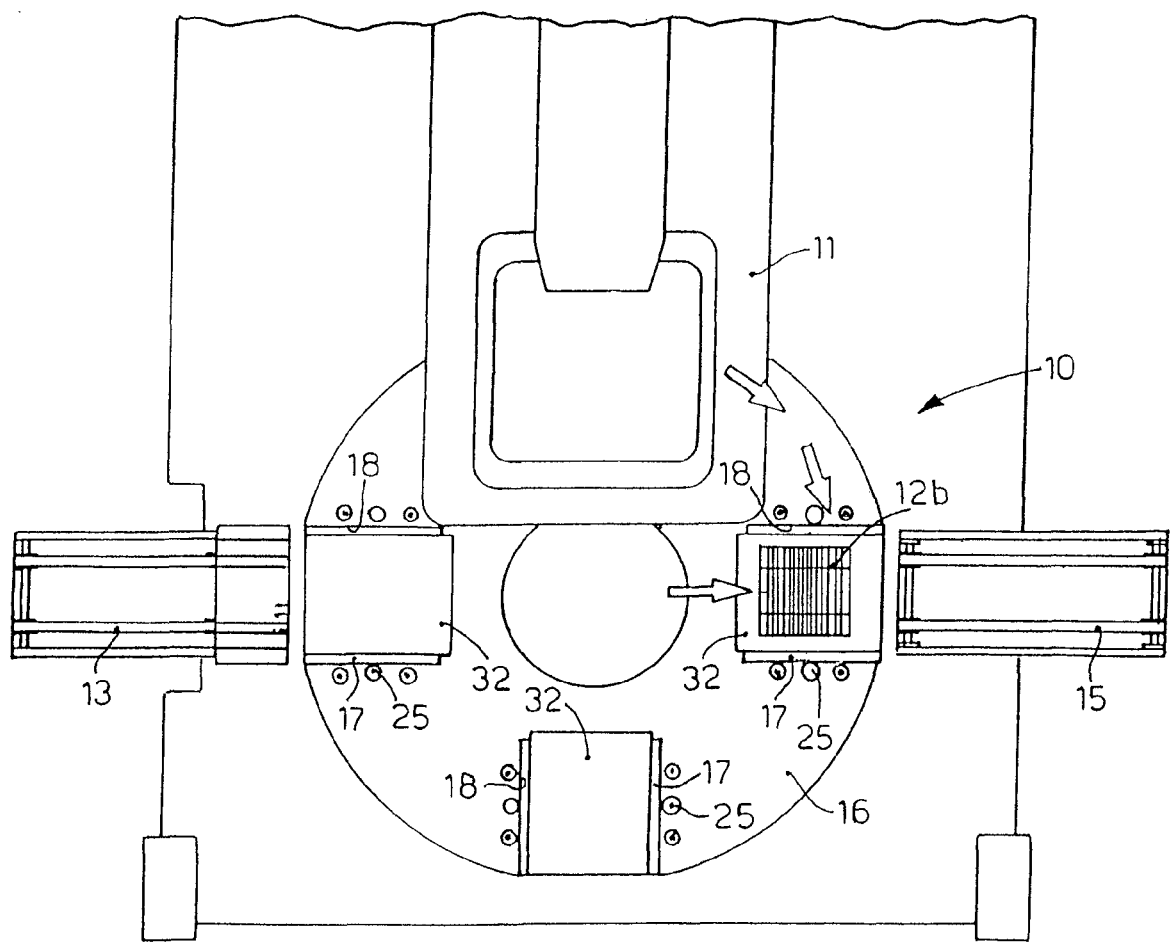
Figure 4E:
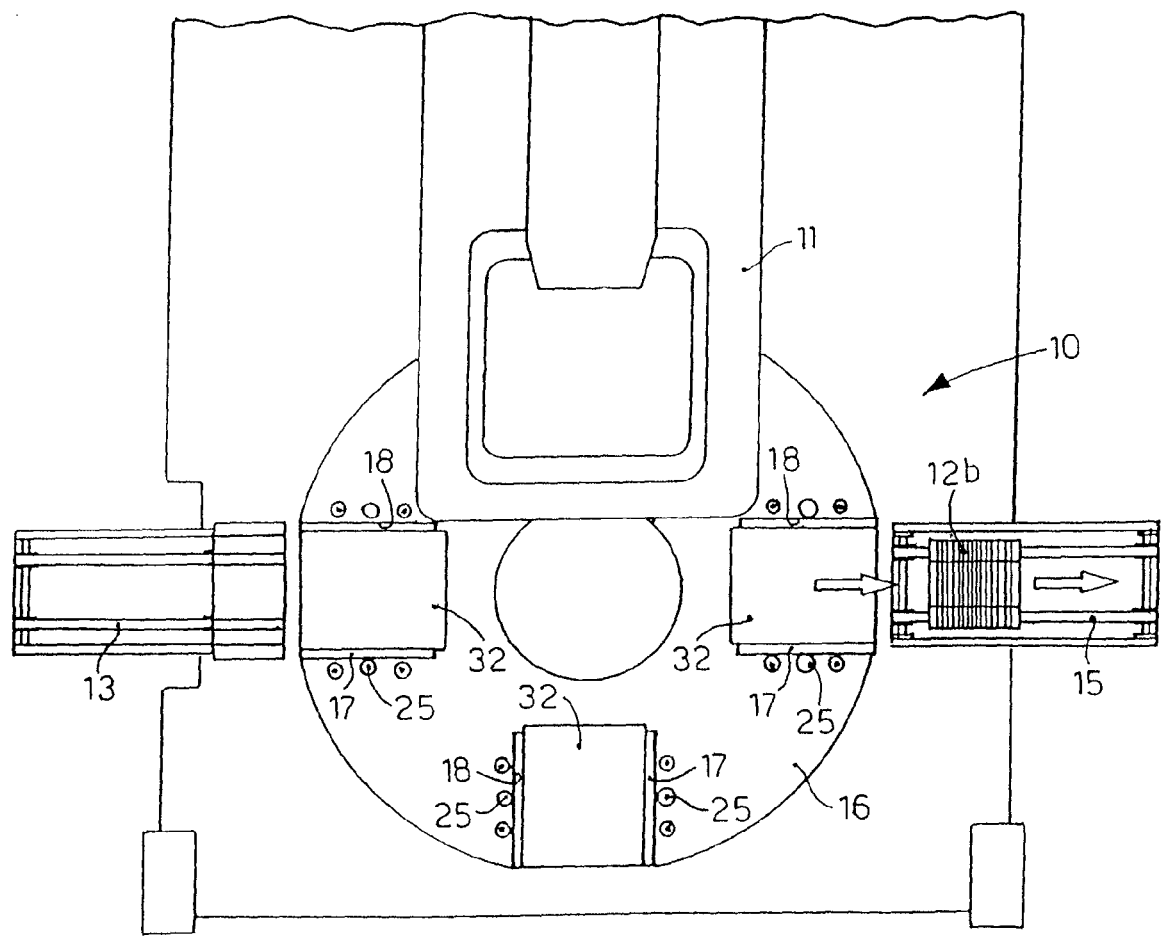

Under the upper surface 29 a heating member 40 is also provided, shown by a line of dashes in FIG. 3.

The heating member 40 is able to determine a desired heating of the upper surface 29, in order to heat also the wafer 12a or the photovoltaic cell 12b, positioned on the paper strip 23, to a determinate temperature.

The heating temperature actuated by the heating member 40 is chosen manually, or automatically, according to the specific operating conditions of the device 10, to the type of photovoltaic cell 12b, or other circuit, to be made, to the type of coating, to the temperature of the metal paste deposited, or to other parameters programmed or programmable each time.

The choice of heating temperature can be modulated and regulated from one step to another of the production process of the photovoltaic cells 12b.

Advantageously, the upper surface 29 is also retro-illuminated so as to facilitate possible operations to sight and correct the position of the photovoltaic cell 12b on the paper strip 32.

The paper strip 32 is initially disposed in a reel on a first of the two supporting rollers 30, it is disposed above the upper surface 29, and is wound onto a second of the two supporting rollers 31. A movement roller 33 is also provided on the frame, keyed to the second supporting roller 31.

Figure 2:
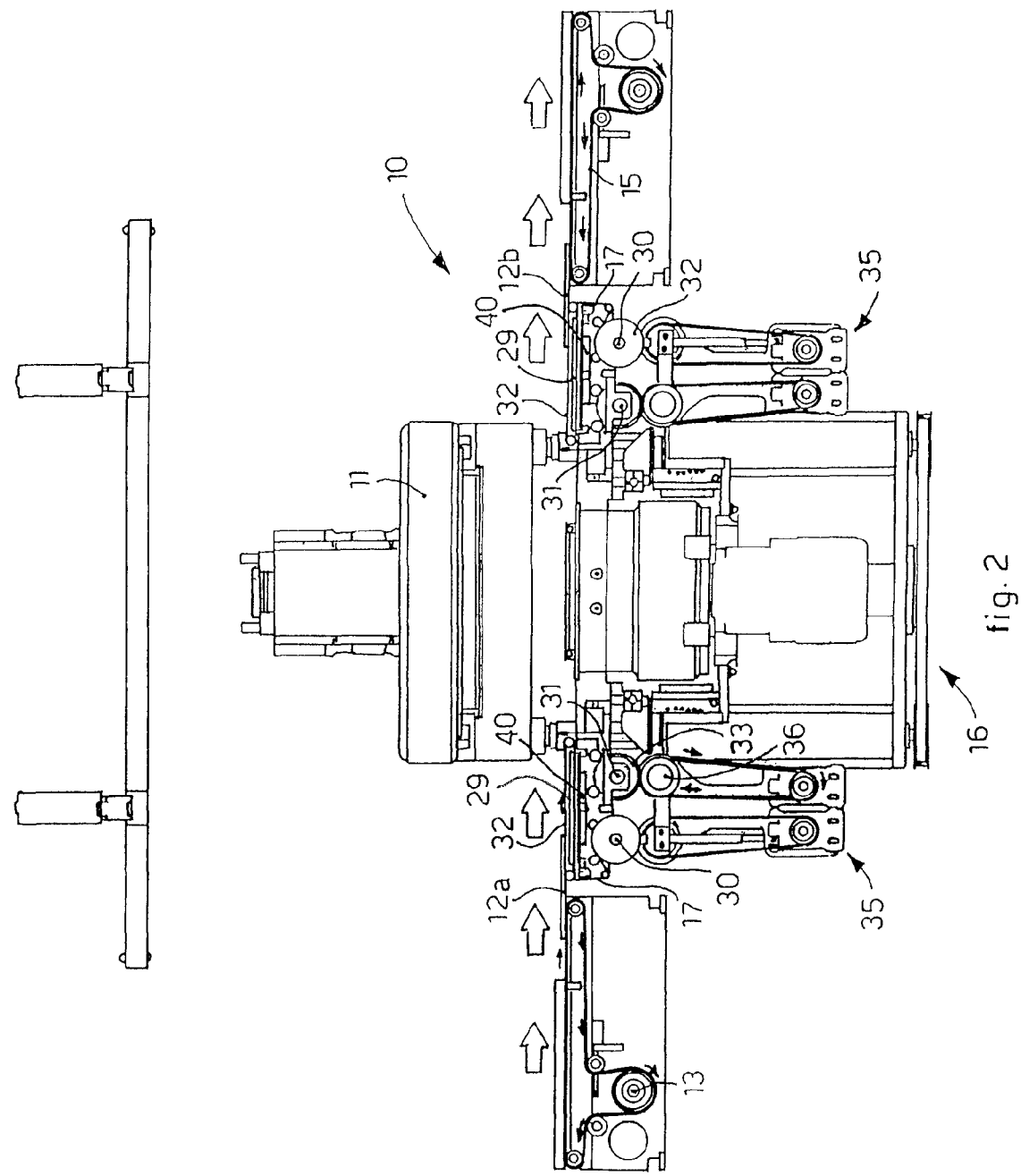
FIG. 2 schematically shows a partially sectioned lateral view in FIG. 1.

The positioning device 10 also comprises (FIG. 2), at least a movement mechanism 35, in this case two, mounted on a fixed part of the rotating turret 16, in correspondence with the first conveyor belt 13 and the second conveyor belt 15.

Each movement mechanism 35 is provided with at least a motorized wheel 36 disposed so as to contact the movement roller 33 and actuate its winding/unwinding rotation of the paper strip 32. This type of motion transmission is known as "pinch roller".

With reference to FIGS. from 4a to 4e, the device 10 according to the present invention functions as follows.

To give a non-restrictive example, FIGS. 4a to 4e schematically show the movement cycle of a single silicon wafer 12a, from which the photovoltaic cell 12b is made. It is clear that in real operating conditions the wafers 12a can be loaded substantially in a continuous cycle, in order to optimize the productivity of the photovoltaic cells 12*b*.

The silicon wafers 12*a* are carried by the first conveyor belt 13 towards the rotating turret 16, which is angularly positioned so as to present a first frame 24 of the positioning device 10 facing towards the first conveyor belt 13, with the paper strip 32 in a winding movement around the second supporting roller 31.

The silicon wafer 12*a* is then positioned on the paper strip 32, and is moved by the latter until it reaches a position substantially central with respect to the upper surface 29. Simultaneously with the movement of the silicon wafer 12*a*, the pneumatic depression is caused by means of the suction holes 34, in order to hold the wafer 12*a* close to the paper strip 32, preventing lateral movements thereof as much as possible.

During this movement the heating member 40 is also activated so as to heat the wafer 12*a* to a determinate temperature during the metal deposition step.

Maintaining the pneumatic depression active, the rotating turret 16 is made to rotate by about 90°, in order to bring the silicon wafer 12*a* into cooperation with the metal deposition unit 11.

During this step, a new silicon wafer 12*a* can be loaded, onto a paper strip 32 of a following frame 24.

According to a variant, in which the heating member 40 is not activated in the preceding movement step, the heating member 40 is activated during the deposition of the metal.

According to another variant, the heating member 40 activated in the movement step is de-activated during the metal deposition step.

Once the deposition of the metal has terminated, and therefore a photovoltaic cell 12*b* has been formed, the rotating turret 16 is rotated by a further 90°, so as to bring the frame 24 into correspondence with the second conveyor belt 15.

According to a variant, in which the heating member 40 is not activated in either the movement step, or the metal deposition step, the heating member 40 is activated during the exit movement from the unit 11, so as to improve the drying conditions for the deposited metal.

According to another variant, the heating member 40 activated during the movement step and during the metal deposition step, is de-activated during the exit movement from the metal deposition unit 11.

According to a further variant, the heating member 40 activated during the movement step and during the metal deposition step, is maintained active.

In this position, the paper strip 32 is moved in order to transport the photovoltaic cell 12*b* on the second conveyor belt 15, and thus discharge it towards other operating stations of the plant.

Once the paper strip has finished 32, the attachment pins 25 are removed, and the corresponding frame 24 is extracted from its assembly seating 18 by sliding the mechanical attachment members 19. The electric attachment members 20 and the pneumatic attachment members 20 are conformed so as to autonomously disconnect once the frame 24 begins to be extracted.

A new frame 24, or the same frame 24, is then prepared, with a new paper strip 32, and is re-inserted in the assembly seating 18. The insertion is achieved by sliding the mechanical attachment members 19. The electric attachment members 20 and the pneumatic attachment members 20 are conformed so as to automatically connect as soon as the insertion of the frame 24 into the assembly seating 18 is complete.

It is clear, however, that modifications and/or additions of parts may be made to the positioning device 10 as described heretofore, without departing from the field and scope of the present invention.

For example, it also comes within the field and scope of the invention to provide that instead of the attachment pins 25 and the relative interruptions 23, the mechanical locking of the frame 24 in the relative assembly seating 18 can be performed by means of snap-in mechanisms, servo commanded electronically or pneumatically, by same-shape coupling or other, able to guarantee an easily removable locking of the frame.

It also comes within the field and scope of the invention to provide that instead of the paper strip 32 a roll of any other transpirant material may be used.

It is also clear that, although the present invention has been described with reference to specific examples, a person of skill in the art shall certainly be able to achieve many other equivalent forms of device for positioning plates for electronic circuits, in a metal deposition unit, and relative method, having the characteristics as set forth in the claims and hence all coming within the field of protection defined thereby.

The invention claimed is:

1. A device for positioning a substrate, comprising:
   a positioning member comprising:
      a removable frame having a retaining surface;
      a winding roller rotatably coupled to the frame;
      an unwinding roller rotatably coupled to the frame, wherein the winding and unwinding roller are configured so that a transpirant material can be wound between the winding roller and the unwinding roller and disposed over the retaining surface of the frame; and
      a rotary member able to rotate at least between a first operating position and a second operating position, wherein the rotary member comprises an assembly seating, and the removable frame comprises one or more rapid mechanical attachment members comprising one or more linear ribs along at least a side of the removable frame such that the one or more linear ribs are slidably engagable with the assembly seating to allow coupling and decoupling of the removable frame with the rotary member.

2. The device of claim 1, wherein the positioning member further comprises a heating device disposed adjacent to the retaining surface of the frame.

3. The device of claim 1, wherein the assembly seating has one or more attachment grooves for receiving the one or more linear ribs.

4. The device of claim 1, wherein the one or more linear ribs comprise at least two linear ribs having an interruption disposed between the two linear ribs defining a position of the removable frame within the assembly seating.

5. The device of claim 1, wherein the removable frame comprises one or more rapid electrical attachment members.

6. The device of claim 5, wherein the one or more rapid electrical attachment members comprise one or more metal platelets coupled to a front wall of the removable frame, and wherein the assembly seating comprises one or more corresponding electric conductors to contact the one or more metal platelets.

7. The device of claim 1, wherein the removable frame comprises one or more rapid pneumatic attachment members.

8. The device of claim 7, wherein the one or more rapid pneumatic attachment members comprise one or more conduits formed in a front wall of the removable frame, the one or more conduits are fluidly coupled with the retaining surface of the frame, and the assembly seating comprises one or more corresponding pneumatic connections to couple with the one or more pipes.

9. The device of claim 1, further comprising:
a movement device coupled to the rotary member to position the transpirant material in a desired location on the retaining surface of the frame.

10. The device of claim 9, wherein the movement device comprises at least a driven roller positioned to selectively contact the winding and unwinding rollers.

11. The device of claim 1, wherein the frame comprises lighting means disposed on a side of the transpirant material on which the retaining surface is disposed.

12. The device of claim 1, wherein the frame comprises a suction device coupled to the frame to create a vacuum pressure between a substrate disposed on a first surface of the transpirant material and the retaining surface of the frame, which is adjacent to a second surface of the transpirant material.

13. The device of claim 1, wherein the transpirant material comprises paper.

14. The device of claim 1, further comprising a plurality of attachment pins capable of temporarily locking the removable frame to the assembly seating.

15. The device of claim 1, wherein the winding roller and the unwinding roller are mounted on the removable frame.

16. The device of claim 15, wherein the removable frame further comprises a movement roller coupled to one or more of the winding roller or the unwinding roller.

17. The device of claim 15, further comprising a movement mechanism mounted on the rotary member and comprising at least a motorized wheel disposed so as to contact the movement roller when the removable frame is coupled to the rotary member.

18. A device for positioning a substrate, comprising:
a positioning member comprising:
a removable frame having a retaining surface;
a winding roller rotatably coupled to the frame;
an unwinding roller rotatably coupled to the frame, wherein the winding and unwinding roller are configured so that a transpirant material can be wound between the winding roller and the unwinding roller and disposed over the retaining surface of the frame; and
a rotary member able to rotate at least between a first operating position and a second operating position, wherein the rotary member comprises an assembly seating, the removable frame is configured to allow coupling and decoupling of the removable frame with the assembly seating of the rotary member, the removable frame comprises one or more rapid electrical attachment members comprising one or more metal platelets coupled to a front wall of the removable frame, and the assembly seating comprises one or more corresponding electric conductors to contact the one or more metal platelets.

19. The device of claim 18, wherein the removable frame comprises one or more linear ribs along at least two sides of the removable frame, wherein the one or more linear ribs are configured to be supported by the assembly seating when the removable frame is coupled to the assembly seating.

20. The device of claim 19, wherein the assembly seating has one or more attachment grooves for receiving the one or more linear ribs.

21. The device of claim 20, further comprising a plurality of attachment pins capable of temporarily locking the removable frame to the assembly seating.

22. A device for positioning a substrate, comprising:
a positioning member comprising:
a removable frame having a retaining surface;
a winding roller rotatably coupled to the frame;
an unwinding roller rotatably coupled to the frame, wherein the winding and unwinding roller are configured so that a transpirant material can be wound between the winding roller and the unwinding roller and disposed over the retaining surface of the frame; and
a rotary member able to rotate at least between a first operating position and a second operating position, wherein the rotary member comprises an assembly seating, the removable frame is configured to allow coupling and decoupling of the removable frame with the assembly seating of the rotary member, the removable frame comprises one or more rapid pneumatic attachment members comprising one or more pipes disposed in a front wall of the removable frame and in fluid communication with the retaining surface of the frame, and the assembly seating comprises one or more corresponding pneumatic connections to couple with the one or more pipes.

23. The device of claim 22, wherein the removable frame comprises one or more linear ribs positioned along each of two sides of the removable frame, wherein the one or more linear ribs are configured to be supported by the assembly seating when the removable frame is coupled to the assembly seating.

24. The device of claim 22, further comprising a locking mechanism capable of temporarily locking the removable frame to the assembly seating.

* * * * *